(12) United States Patent
Tamiya

(10) Patent No.: US 11,068,632 B2
(45) Date of Patent: Jul. 20, 2021

(54) SIMULATION APPARATUS, DESCRIPTION CONVERSION METHOD AND SIMULATION METHOD

(71) Applicant: FUJITSU LIMITED, Kawasaki (JP)

(72) Inventor: Yutaka Tamiya, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/789,664

(22) Filed: Feb. 13, 2020

(65) Prior Publication Data
US 2020/0285793 A1  Sep. 10, 2020

(30) Foreign Application Priority Data

Mar. 8, 2019 (JP) .............................. JP2019-042590

(51) Int. Cl.
*G06F 30/3308* (2020.01)

(52) U.S. Cl.
CPC ................................ *G06F 30/3308* (2020.01)

(58) Field of Classification Search
CPC .................................................. G06F 30/3308
See application file for complete search history.

(56) References Cited

U.S. PATENT DOCUMENTS

2003/0188299 A1* 10/2003 Broughton .............. G06F 8/443
717/141
2013/0304450 A1* 11/2013 Tsai ........................ G06F 30/33
703/14

FOREIGN PATENT DOCUMENTS

| JP | 8-106476 | 4/1996 |
|---|---|---|
| JP | 10-27185 | 1/1998 |
| JP | 11-85832 | 3/1999 |
| JP | 2001-338008 | 12/2001 |

OTHER PUBLICATIONS

K. Khoo et al., "Cycle-Based Timing Simulation Using Event-Streams", Proc. of ICCD, Oct. 1996.
Kumar N. Lalgudi et al., "Retiming Edge-Triggered Circuits Under General Delay Models", IEEE Trans. On Computer-Aided Design of Integrated Circuits and Systems, vol. 16, No. 12, Dec. 1997.

* cited by examiner

*Primary Examiner* — Vuthe Siek
(74) *Attorney, Agent, or Firm* — Staas & Halsey LLP

(57) ABSTRACT

A simulation apparatus includes a memory and a processor. The processor is configured to: acquire a circuit model described in a hardware description language; extract a reading and writing relationship between a process and a register variable included in the circuit model; determine an evaluation order of the process, based on the number of register variables whose extracted relationship satisfies a given condition; and convert, into a blocking variable, a register variable which satisfies the given condition in the determined evaluation order of the process among the register variables included in the circuit model.

15 Claims, 11 Drawing Sheets

FIG. 8

| | PROCESS TYPE | registerA | registerB | registerC | registerD |
|---|---|---|---|---|---|
| process1 | SEQUENTIAL CIRCUIT | Read | Write | | |
| process2 | SEQUENTIAL CIRCUIT | Read | | Write | |
| process3 | COMBINATIONAL CIRCUIT | | | Read | Write |
| process4 | SEQUENTIAL CIRCUIT | Write | Read | | Read |

FIG. 9

| | EVALUATION ORDER | PROCESS TYPE | registerA | registerB | registerC | registerD |
|---|---|---|---|---|---|---|
| process4 | 1 | SEQUENTIAL CIRCUIT | Write | Read | | Read |
| process1 | 2 | SEQUENTIAL CIRCUIT | Read | Write | | |
| process2 | 3 | SEQUENTIAL CIRCUIT | Read | | Write | |
| process3 | 4 | COMBINATIONAL CIRCUIT | | | Read | Write |

FIG. 10

```
module MOD (clock);
input clock;
reg [15:0] A=0, B=1, C=0, D=1;
always @(posedge clock) begin
    B <= A + 1;        /* process1 */
    C <= A * 2;        /* process2 */
    A <= B * D;        /* process4 */
end
always @ (C)
    D = C + 1;         /* process3 */
endmodule
```

↑ REGISTER VARIABLE REDUCTION

```
module MOD (clock);
input clock;
reg [15:0] A=0;
reg [15:0] B=1, C=0, D=1;  //blocking
always @(posedge clock) begin
    A <= B * D;
    B = A + 1;         /* process4 */
    C = A * 2;         /* process1 */
    D = C + 1;         /* process2 */
                       /* process3 */
end
endmodule
```

FIG. 11

```
#include <systemc.h>
class MOD : sc_module {
public:
    sc_in clock;
    sc_signal<int16_t> A, B, C, D;
    SC_CTOR(MOD) {
        A=0; B=1; C=0; D=1;
        SC_METHOD(proc1);
        sensitive << clock.pos();
        SC_METHOD(proc2);
        sensitive << C;
    }
    void proc1() {
        B = A + 1;        /* process1 */
        C = A * 2;        /* process2 */
        A = B * D;        /* process4 */
    }
    void proc2() {
        D = C + 1;        /* process3 */
    }
};
```
31

⇧ REGISTER VARIABLE REDUCTION

```
#include <systemc.h>
class MOD : sc_module {
public:
    sc_in clock;
    sc_signal<int16_t> A;
    int16_t B, C, D;
    SC_CTOR(MOD) {
        A=0; B=1; C=0; D=1;
        SC_METHOD(proc1);
        sensitive << clock.pos();
    }
    void proc1() {
        A = B * D;        /* process4 */
        B = A + 1;        /* process1 */
        C = A * 2;        /* process2 */
        D = C + 1;        /* process3 */
    }
};
```
32

SIMULATION APPARATUS, DESCRIPTION CONVERSION METHOD AND SIMULATION METHOD

CROSS-REFERENCE TO RELATED APPLICATION

This application is based upon and claims the benefit of priority of the prior Japanese Patent Application No. 2019-42590, filed on Mar. 8, 2019, the entire contents of which are incorporated herein by reference.

FIELD

The embodiment discussed herein is related to a simulation apparatus, a description conversion method and a simulation method.

BACKGROUND

In the design of digital circuits, an object circuit is described in a hardware description language (HDL) such as Verilog, VHSIC Hardware Description Language (VHDL), and SystemC, and a logic function of this circuit description is debugged by using logic simulation.

A circuit model of HDL is a network composed of a process and a register variable. Among these, the process represents a module that operates in parallel, such as a combinational circuit and a sequential circuit. Hereinafter, causing a process to execute an operation of performing an arithmetic processing with a register variable as an input and outputting the result to the register variable is referred to as "evaluating a process". A register variable represents a signal line for holding a value, such as Flip-Flop (FF) or latch. The register variable has two values of a current value (curr) and a next time value (next), and the current value is used for an input of the process, and the next time value is used for an output. After the process has been evaluated, when Δt (minute time) has elapsed, the current value of the register variable is overwritten with the next time value. Hereinafter, overwriting the current value of the register variable with the next time value is referred to as "update a register".

Since a logic simulation is repeatedly executed in the circuit design, a speed increase is directly coupled to the efficiency of a design work.

As an example of an execution method of speeding up the logic simulation, a cycle-based simulation is exemplified. In the cycle-based simulation, a process evaluation and a register update occurring in one clock are executed according to the order determined in advance from circuit configuration information. Since the evaluation of each process and the update of each register variable are executed at most once within one clock, the operation amount is reduced as compared with an event driven type, so that a simulation speed is increased.

1) Japanese Laid-open Patent Publication No. 08-106476, 2) Japanese Laid-open Patent Publication No. 10-027185, 3) Japanese Laid-open Patent Publication No. 11-085832, and 4) Japanese Laid-open Patent Publication No. 2001-338008 are examples of related art.

1) Kei-Yong Khoo, Alan N. Willson, Jr., "Cycle-Based Timing Simulation Using Event-Streams", Proc. of ICCD 1996 and 2) Kumar N. Lalgudi and Marios C. Papaefthymiou, "Retiming Edge-Triggered Circuits Under General Delay Models", IEEE Trans. on Computer-Aided Design of Integrated Circuits and Systems (Vol. 16, Issue: 12, December 1997) are examples of related art.

SUMMARY

According to an aspect of the embodiments, a simulation apparatus includes: a memory; and a processor, coupled to the memory, configured to: acquire a circuit model described in a hardware description language; extract a reading and writing relationship between a process and a register variable included in the circuit model; determine an evaluation order of the process, based on the number of register variables whose extracted relationship satisfies a given condition; and convert, into a blocking variable, a register variable which satisfies the given condition in the determined evaluation order of the process among the register variables included in the circuit model.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a diagram illustrating an example of relationship data of a register variable;

FIG. 9 is a diagram illustrating an example of the relationship data of the register variable with a process evaluation order;

FIG. 10 is a diagram illustrating an example of Verilog description;

FIG. 11 is a diagram illustrating an example of SystemC description;

DESCRIPTION OF EMBODIMENTS

In recent years, since circuits such as a processor, a central processing unit (CPU), and a graphics processing unit (GPU) are large-scaled, HDL description has many processes and register variables. In particular, the number of register variables affects the number of register updates in a logic simulation, which causes deterioration of performance of the logic simulation.

While the circuit of the processor is increased in size as described above, there is a limit to speeding up the simulation execution in the above-described cycle-based simulation.

With reference to the attached drawings, a description conversion method, a simulation method, and a description conversion program according to the present application will be described below. It is not intended that the technology disclosed here is limited by embodiments. The embodiments may be appropriately combined without contradiction of details of processing.

First Embodiment

System Configuration

Figure 1:
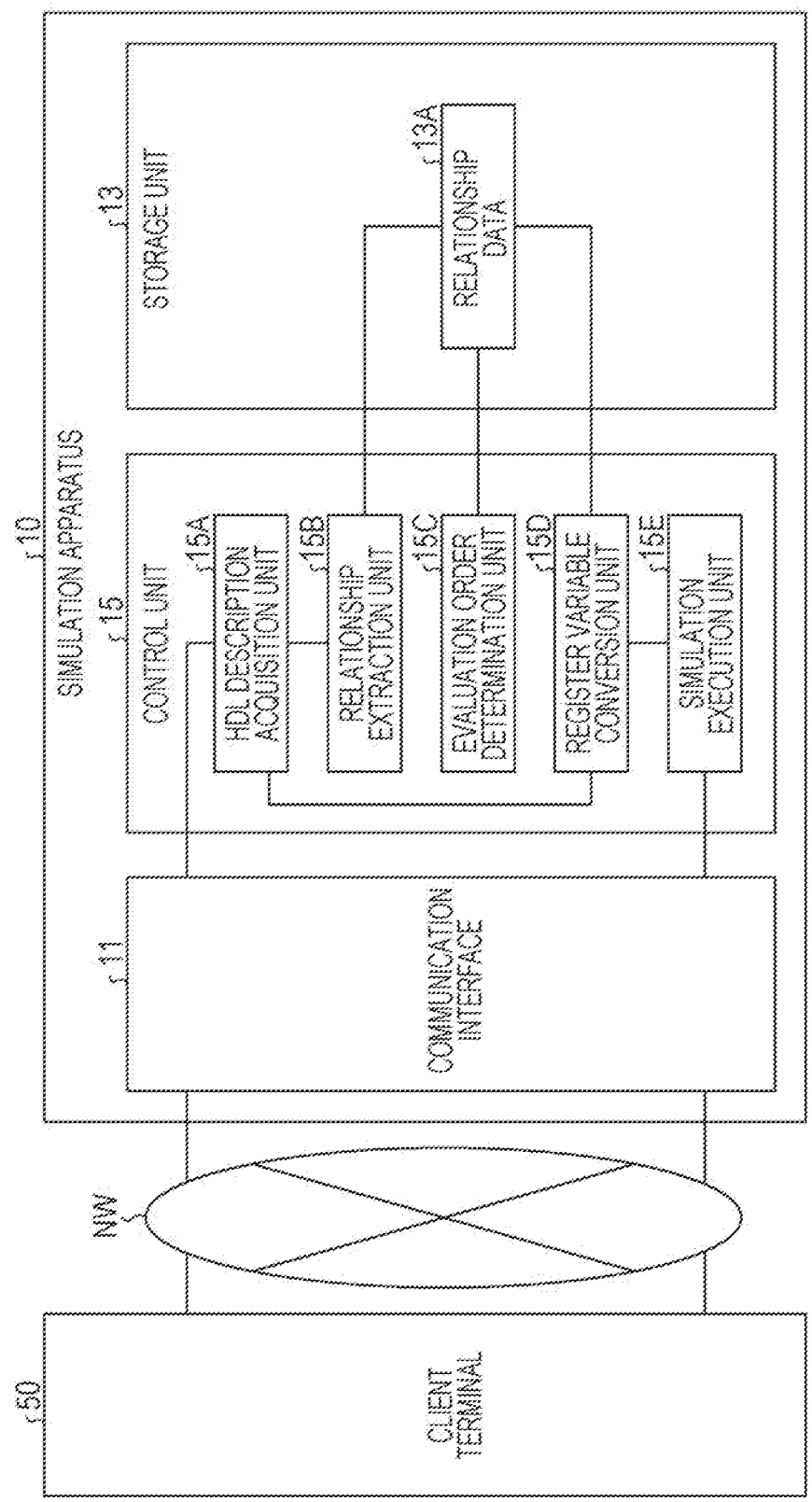
FIG. 1 is a block diagram illustrating an example of a functional configuration of a simulation apparatus according to a first embodiment.

FIG. 1 is a block diagram illustrating an example of a functional configuration of a simulation apparatus 10 according to a first embodiment. A simulation system 1 illustrated in FIG. 1 provides a logic simulation function for verifying an operation of a circuit model described in HDL, from the viewpoint of supporting the design of the digital circuit.

As illustrated in FIG. 1, the simulation system 1 may include the simulation apparatus 10 and a client terminal 50. The simulation apparatus 10 and the client terminal 50 are coupled to each other via a network NW so as to be able to communicate with each other. The network NW may be any type of communication network such as the Internet or a local area network (LAN), regardless of being wired or wireless. Although FIG. 1 illustrates an example in which one client terminal 50 is coupled to one simulation apparatus 10 for convenience of explanation, a plurality of the client terminals 50 may be coupled to one server apparatuses 10.

The simulation apparatus 10 is an example of a computer that provides the function of the logic simulation described above.

In one embodiment, the simulation apparatus 10 may be implemented as an electronic design automation (EDA) tool by installing the logic simulator for realizing the function of the logic simulation in an optional computer. For example, the simulation apparatus 10 may be implemented as a server that provides the function of the logic simulation described above to on-premise. The simulation apparatus 10 is not limited to the server, and may be implemented as a software as a service (SaaS) type application, and the function of the logic simulation may be provided as a cloud service.

The client terminal 50 corresponds to an example of a computer used by a client receiving the function of the logic simulation described above. As one example of such a client, there are the general parties involved in the design of digital circuits. The client terminal 50 corresponds to a desktop or laptop personal computer or the like. This is merely an example, and the client terminal 50 may be an optional computer such as a portable terminal device or a wearable terminal device.

Although FIG. 1 illustrates an example in which the function of the logic simulation is provided by a client server system, the function of the logic simulation may be implemented in a stand-alone manner.

Example of Circuit Model

A circuit model of HDL is a network composed of a process and a register variable. Among these, the process represents a module that operates in parallel, such as a combinational circuit and a sequential circuit. Hereinafter, causing a process to execute an operation of performing an arithmetic processing with a register variable as an input and outputting the result to the register variable is referred to as "evaluating a process". The register variable represents a signal line for holding a value, such as FF or latch. The register variable has two values of a current value and a next time value, and the current value is used for an input of the process, and the next time value is used for an output. After the process has been evaluated, when Δt (minute time) has elapsed, the current value of the register variable is overwritten with the next time value. Hereinafter, overwriting the current value of the register variable with the next time value is referred to as "update a register".

Figure 2:
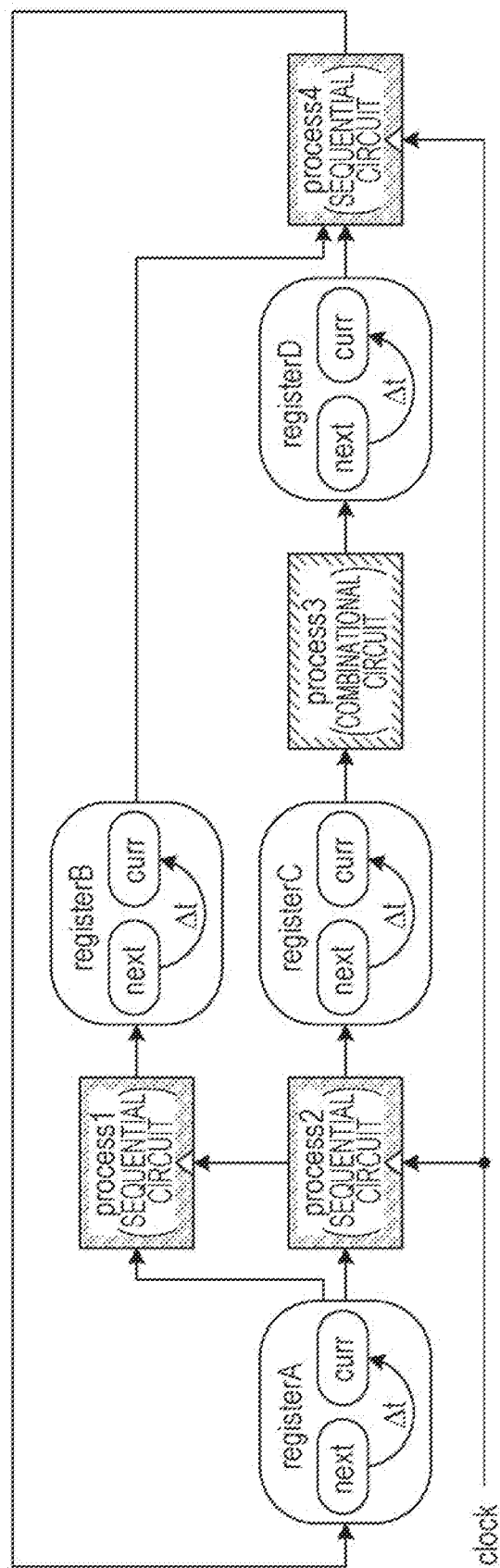
FIG. 2 is a diagram illustrating an example of a circuit model of HDL.

FIG. 2 is a diagram illustrating an example of the circuit model of HDL. In FIG. 2, the sequential circuits are indicated by dot pattern shading, the combinational circuits are indicated by hatched shading, and the register variables are indicated by white color-filled. Examples of the circuit model of the HDL illustrated in FIG. 2 include four processes of a process1 to a process4 and four register variables of a registerA to a registerD. Among these four processes, the process1, the process2, and the process4 are sequential circuits that are modeled to operate upon input of a clock signal. In addition, the process3 is a combinational circuit that is modeled to operate when the value of the register variable of the input changes regardless of the clock.

Figure 3:
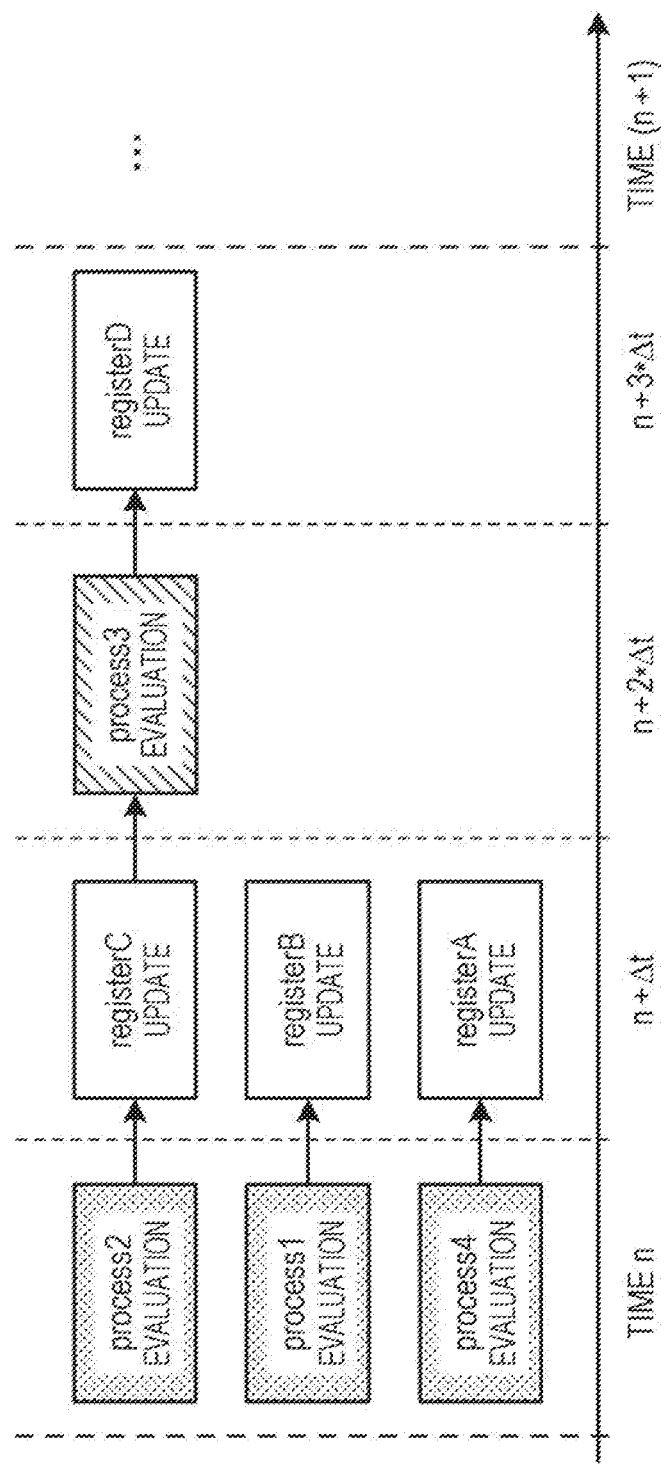
FIG. 3 is a diagram illustrating an example of a process evaluation and a register update.

In a case where the cycle-based simulation is performed on the circuit model of the HDL illustrated in FIG. 2, a state of the process evaluation and the register update executed within one clock is as illustrated in FIG. 3. FIG. 3 is a diagram illustrating an example of a process evaluation and a register update. As illustrated in FIG. 3, at a time n at which a clock signal is input, the evaluation for the process1, process2, and process4 that are synchronized with the clock is performed. Subsequently, after the lapse of time Δt from the time n, a current value of the register variable is overwritten with a next time value in the registerB, registerC and registerA in which the outputs of the process1, process2 and process4 are written. Thereafter, after the lapse of another time Δt from the time n+Δt, the evaluation of the combinational circuit process3 is performed. Finally, after the lapse of still another time Δt from the time n+2*Δt, the current value of the register variable is overwritten with the next time value in the registerD.

As described above, in the cycle-based simulation, since the evaluation of the process and the update of the register variable are executed at most once within one clock, the operation amount may be further reduced as compared with the event driven type.

One Aspect of Problem

Since a circuit such as a processor, for example, a multi-core CPU or a GPU, has a large scale in recent years, the HDL description has many processes and register variables. In particular, the number of register variables affects the number of register updates in a logic simulation, which causes deterioration of performance of the logic simulation.

In this way, the circuit of the processor in recent years has been increasing in size, and there is a limit to speeding up the simulation execution in the above-described cycle-based simulation.

There is also a technique called Retiming which reduces the number of registers. The Retiming is a technique of reducing the number of registers without changing the logic operation of the circuit by relocating the register on the input side of the combinational circuit to the output side or relocating the register on the output side to the input side.

However, Retiming is not effective as a method of reducing a register at the time of the logic simulation, so that the effect of reducing the register is limited.

First, Retiming is applicable only to the combinational circuit, and since there is a severe restriction to relocate the register from the input side to the output side or from the output side to the input side, the scene itself to which Retiming may be applied is limited. For example, when the register on the input side of the combinational circuit is relocated to the output side, if there is one or more registers at all inputs on the input side of the combinational circuit, the register may not be relocated to the output side. In addition to such limitations, if the number of inputs is not greater than the number of outputs in the combinational circuit, the effect of reducing the register may not be obtained. The same is true for a case where the register on the output side is relocated to the input side.

Second, since a reset state of the register is changed by the relocation, it is required to recalculate the value at the time of resetting the register, but it is difficult to recalculate the reset state. For example, in a case where the register on the input side of the combinational circuit is relocated to the output side, it is required to recalculate the value at the time of resetting using a function of the process, but whether or not the value is allowed as a logic circuit also requires to be verified by the designer of the circuit model. Further, in a case where the register on the output side of the combinational circuit is relocated to the input side, it is required to generate an inverse function of the process to recalculate the reset value at the time of reset, but it is not normally possible to create the inverse function.

From these facts, it is difficult to apply the Retiming to the logic simulation.

One Aspect of Approach to Solve the Problem

In this regard, in this embodiment, in order to speed up the simulation execution, the register variable of the circuit model described in HDL is converted into a blocking variable, thereby reducing the register variable.

In the logic simulation for the circuit model of HDL illustrated in FIG. 2, the process1 and the process4, and the registerB are excerpted to explain the operation of the register variable.

Figure 4:
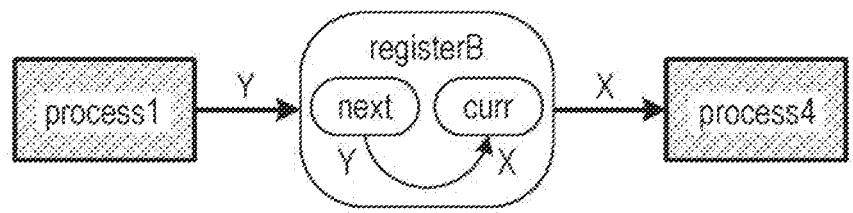
FIG. 4 is a diagram illustrating an example of an operation of a registerB.
Figure 5:
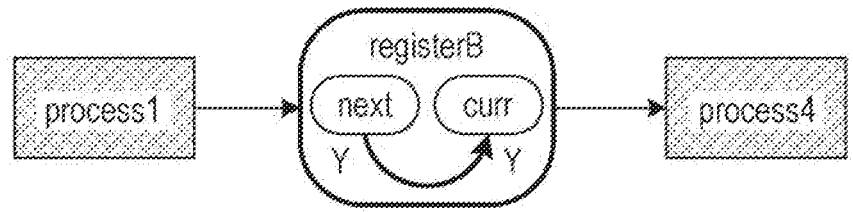
FIG. 5 is a diagram illustrating an example of the operation of the registerB.

FIGS. 4 and 5 are diagrams illustrating an example of the operation of a registerB. FIG. 4 illustrates the operation of the registerB at the time n, while FIG. 5 illustrates the operation of the registerB at the time n+Δt.

As illustrated in FIG. 4, at the time n, the value of the registerB is assumed to be X. By evaluation of the process, the process1 and the process4 perform writing and reading on the registerB, respectively. In the registerB at the time n, Y is written into the next time value (next) by process1, and X is read out from the current value (curr) by process4. After the lapse of time Δt from the time n, the current value is overwritten with the next time value in the registerB as illustrated in FIG. 5. As a result, the current value has a value Y.

As described above, when the process is evaluated in parallel, the register variable has two values (current value and next time value) in the implementation of the logic simulation for the purpose of performing a correct operation even when the writing and the reading are performed on the same register variable at the same time. The update of the register variable is required to synchronize the two values of the register variable.

In this embodiment, the "blocking variable" is defined as follows. The "blocking variable" is a variable representing a register which holds a value in the circuit model of the logic simulation, and the written value is a variable which may be immediately read. On the HDL description, the blocking variable is a register variable which generally uses a blocking substitution at the time of substitution, for example, "=" in a Verilog grammar. However, unlike the register variable, the blocking substitution is generally performed, and thus only one current value is held.

The register variable registerB is converted into a blocking variable b blockingB. Then, using the property of "the process to be evaluated in parallel is evaluated sequentially, and the operation of the logic simulation remains correct", the evaluation order of the processes is determined so as to perform the same operation as illustrated in FIGS. 4 and 5. Specifically, the process of reading the converted blocking variable is evaluated first, and then the writing process is evaluated.

Figure 6:
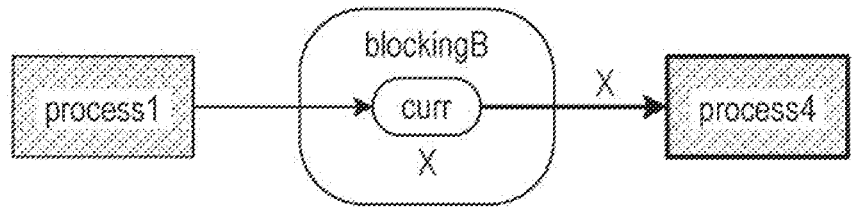
FIG. 6 is a diagram illustrating an example of an operation of a blockingB.
Figure 7:
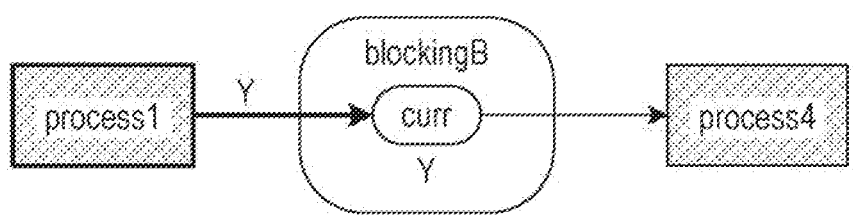
FIG. 7 is a diagram illustrating an example of the operation of the blockingB.

FIGS. 6 and 7 are diagrams illustrating an example of the operation of the blockingB. FIG. 6 illustrates the operation (first half) of the blockingB at the time n, while FIG. 7 illustrates the operation of the blockingB at the time n (second half).

As illustrated in FIG. 6, it is assumed that the value of the blockingB is X at the time n. In the present embodiment, in order to ensure the operation of the logic simulation even when the blocking variable is used, the evaluation of process4 is executed first among the evaluation of the process1 and the process4. In other words, in the blockingB, the value X is read by the process4. After the evaluation of the process4 is performed first, the evaluation of the process1 is performed. That is, as illustrated in FIG. 7, in the blockingB, the value Y is written by the process1. As a result, as in the case of the registerB illustrated in FIGS. 4 and 5, since each process reads and writes the input and output values, it is ensured that the logic simulation is correctly performed.

Thus, when the register variable is converted into the blocking variable, the operation of the logic simulation is correctly performed, and thereby the number of register variable updates is reduced accordingly.

Functional configuration of simulation apparatus

Next, a functional configuration of the simulation apparatus 10 equipped with the function of the logic simulator according to the present embodiment will be described. As illustrated in FIG. 1, the simulation apparatus 10 includes a communication interface 11, a storage unit 13, and a control unit 15. Note that, FIG. 1 illustrates solid lines indicating relationships between data inputting and outputting in a minimum portion for the purpose of illustration. In other words, data inputting and outputting related to each of the processing units is not limited to the illustrated example, but data inputting and outputting may be executed between processing units, between a processing unit and data, and between a processing unit and an external device.

The communication interface 11 is an interface that performs communication control between other devices, for instance, the client terminal 50.

By way of example only, a network interface card such as a LAN card may be employed as the communication interface 11. For example, the communication interface 11 receives a logic simulation execution request from the client terminal 50, and transmits the execution result of the logic simulation to the client terminal 50.

The storage unit 13 is a functional unit that stores optional data. For example, the storage unit 13 stores various programs including an operating system (OS) to be executed by the control unit 15. In addition, the storage unit 13 stores various programs such as an HDL description conversion program in which an HDL description conversion function for converting the register variable included in the code described in the above logic simulator or HDL into the blocking variable is modularized.

The HDL description conversion program may be composed of two or more programs.

By way of example only, the storage unit 13 corresponds to an auxiliary storage device in the simulation apparatus 10. A hard disk drive (HDD), an optical disc, a solid state drive (SSD), or the like corresponds to the auxiliary storage device. In addition, a flash memory and an erasable programmable read-only memory (EPROM) also corresponds to an auxiliary storage device.

The storage unit 13 stores relationship data 13A as an example of data to be used for the search program to be executed by the control unit 15. Other than the relationship data 13A, data used for the logic simulation by the logic simulator, for example, a circuit model or an input signal to the circuit model, simulation control information, and the like may also be stored in the storage unit 13. Note that, the description of the relationship data 13A is performed in conjunction with the description of the control unit 15 by which the data is referred or generated.

The control unit 15 is a functional unit that performs overall control of the simulation apparatus 10.

In the first embodiment, the control unit 15 may be implemented by a hardware processor such as a CPU or a microprocessor unit (MPU). Although the CPU and the MPU are exemplified as one example of the processor, it may be implemented by any processor regardless of whether the processor is a general-purpose type or a specific type. The control unit 15 may be enabled by wired logic such as an application specific integrated circuit (ASIC) or a field-programmable gate array (FPGA).

The control unit 15 virtually implements the processing unit illustrated in FIG. 1 by executing the above-described logic simulator over a work area of a RAM such as a dynamic random-access memory (DRAM) which is implemented as a main storage device (not illustrated). An example in which the logic simulator with the above described HDL description conversion function packaged is exemplified, and any function of the above-described logic simulator, for example, an HDL description conversion function may be excerpted and executed as a program module, or may be referred to as a library.

For example, as illustrated in FIG. 1, the control unit 15 includes an HDL description acquisition unit 15A, a relationship extraction unit 15B, an evaluation order determination unit 15C, a register variable conversion unit 15D, and a simulation execution unit 15E.

The HDL description acquisition unit 15A is a processing unit that acquires the code described in the HDL. Hereinafter, a code in which a circuit model is described in HDL may be referred to as an "HDL description".

By way of example only, the HDL description acquisition unit 15A may accept the upload of the HDL description when accepting the execution request of the logic simulation from the client terminal 50. In addition, the HDL description acquisition unit 15A may also designate an HDL description for performing a logic simulation from the HDL description registered in the storage unit 13 of the simulation apparatus 10, an external file server (not illustrated), or the like.

The relationship extraction unit 15B is a processing unit that extracts a reading and writing relationship between the process and the register variable.

In one embodiment, the relationship extraction unit 15B inputs the HDL description of a target circuit acquired by the HDL description acquisition unit 15A, and extracts the relationship between Read and Write to the register variable for each process. At this time, the relationship extraction unit 15B extracts the types of the processes of the sequential circuit or the combinational circuit for each process. The relationship between Read and Write to the register variable extracted for each process is output to relationship data in which a process is set as a row and a register variable is set as a column. At this time, the relationship extraction unit 15B formulates Read-Write constraint by recording the direction of an arrow or the like in accordance with the Read-Write constraint described below for each register variable.

The Read-Write constraint includes three Read-Write constraints (A) to (C).

(A) An arrow is marked to Write (first in a case where a plurality of Writes are present) from Read by the sequential circuit process.

The reason why such a formulation is performed is that when Write is executed after all Read operations are executed for the register variable, the current value (curr) and the next time value (next) remain coincident with each other during the Read operation. This fact is used in the conversion of the register variable into the blocking variable, which is taken into account when determining the evaluation order of the process.

(B) An arrow is marked to Read from Write (first in a case where a plurality of Writes are present) by the combinational circuit process.

The reason why such a formulation is performed is that the combinational circuit process is evaluated after all the input values are determined in the circuit model of the HDL.

(C) In a case where there is Write having a plurality of processes in the same register variable, an arrow is marked in accordance with the order.

The reason why such a formulation is performed is that a plurality of writings to the register variables are reflected on the next time value (next) in the circuit model of HDL.

By way of example only, when the HDL description of the circuit model illustrated in FIG. 2 is input, the relationship data 13A1 of the register variable illustrated in FIG. 8 is created. FIG. 8 is a diagram illustrating an example of the relationship data 13A1 of a register variable. In the circuit model of HDL illustrated in FIG. 2, since the writing of each register variable is limited to one process, the Read-Write constraint (C) is not applied. As illustrated in FIG. 8, the relationship data 13A1 is created by rows of four processes of the process1 to the process4, and columns of four register variables of the registerA to the registerD are created. In addition, the types of four processes of the process1 to the process4 are extracted to the relationship data 13A1. That is, the sequential circuits are extracted as the types of the process1, the process1, and the process4, and the combinational circuit is extracted as the type of process3. In the row of the register variable of the relationship data 13A1, a black ground arrow is set from Read by the sequential circuit process to Write in accordance with the Read-Write constraint (A). In the row of the register variable of the relationship data 13A1, a white ground arrow is set from Write by the combinational circuit process to Read in accordance with the Read-Write constraint (B). Such relationship data 13A1 is stored in the storage unit 13.

The evaluation order determination unit 15C is a processing unit that determines the evaluation order of the process in which the register variable which satisfies the Read-Write constraint becomes the maximum.

In one embodiment, the evaluation order determination unit 15C may activate the processing in a case where the relationship data 13A1 of the register variable is generated. For example, the evaluation order determination unit 15C determines the process evaluation order in which the register variable is minimized by the conversion of the register variable into the blocking variable in the relationship data 13A1 of the register variable output by the relationship extraction unit 15B. In order to determine the evaluation order of the process, the relationship between the Read-Write constraint and the register reduction described below is used. That is, in a case where the logic simulation evaluates the process in the row order of the relationship data 13A1 of the register variable, for example, from the upward direction to the downward direction, it is guaranteed that the simulation result does not change even when the register variable from which all the arrows of the Read-Write constraint are directed to the bottom from the top is converted into the blocking variable. By using the relationship data 13A1 of the register variable thus formulated, the evaluation order determination unit 15C determines the evaluation order of the process so as to maximize the number of register variables which satisfies the Read-Write constraint. Then, the evaluation order determination unit 15C stores the process evaluation order in which the register variables are minimized by the conversion of the register variable to the blocking variable as the relationship data 13A2 of the register variable with the process evaluation order in the storage unit 13.

By way of example only, in a case where the relationship data 13A1 of the register variable illustrated in FIG. 8 is input, the Read-Write constraint (A) is circulated between the registerA and the registerB, as may be seen from the relationship data 13A1 illustrated in FIG. 8. Therefore, there is no evaluation order of the processes which satisfies all of the Read-Write constraints. However, if the process evaluation order illustrated in FIG. 9 is set in the logic simulator, the Read-Write constraint may be satisfied to the maximum extent.

FIG. 9 is a diagram illustrating an example of the relationship data 13A2 of the register variable with a process evaluation order. In the relationship data 13A2 illustrated in FIG. 9, the process evaluation order is set in the order of the process4, the process1, the process2, and the process3. In a case where the process evaluation order is set, the arrow of the Read-Write constraint (A) is directed from the bottom to the top in the registerA. Therefore, the registerA does not satisfy the Read-Write constraint (A), and may not be converted into the blocking variable. On the other hand, in the registerB, the registerC and the registerD, the arrows of the Read-Write constraint (A) or the Read-Write constraint (B) are directed from the top to the bottom. The registerB, the registerC, and the registerD may be converted into the blocking variables. In this way, the process evaluation order illustrated in FIG. 9 may be optimal from the fact that the number of register variables which may not be converted into the blocking variable is 1 (registerA) at a minimum.

The register variable conversion unit 15D is a processing unit that converts the register variable into the blocking variable.

In one embodiment, the register variable conversion unit 15D converts the register variable of the HDL description of an original circuit model into the blocking variable by using the relationship data 13A2 of the register variable with the process evaluation order output by the evaluation order determination unit 15C. The register variable conversion unit 15D outputs the HDL description in which the register variable has been converted into the blocking variable to the simulation execution unit 15E.

By way of example only, in a case where the relationship data 13A2 of the register variable having the process evaluation order illustrated in FIG. 9 is obtained, the register variable conversion unit 15D performs the following operation. That is, the register variable conversion unit 15D converts three register variables of the registerB, the registerC, and the registerD which satisfy the Read-Write constraint (A) and the Read-Write constraint (B) into the blocking variables.

FIG. 10 is a diagram illustrating an example of Verilog description. FIG. 10 illustrates original Verilog description 21 and Verilog description 22 after the register variables are reduced. The substitution statement to each register variable (A, B, C, and D) illustrated in FIG. 2 may be regarded as a process that operates in parallel. As mentioned in the comments, those are named as the process1 to the process4. When the register variable X (={A, B, C, D}) is replaced by registerX, the original Verilog description 21 illustrated in FIG. 10 becomes equivalent to the circuit model illustrated in FIG. 2.

As illustrated by the bold description in FIG. 10, in the original Verilog description 21, the order of the substitution statement (process evaluation order) illustrated in FIG. 9 and the substitution of the variable B, the variable C, and the variable D are replaced by the blocking substitution ("=") from the non-blocking substitution ("<="). Such conversion results in the Verilog description 22 in which the register variables are reduced. In the Verilog description 22, there is a restriction in the evaluation order of the process of evaluating the process in the order of the process4, the process1, the process1, and the process3 as compared with the original Verilog description 21. However, in order to speed up the execution of the logic simulation, there is no disadvantage to change the evaluation order of the processes. On the other hand, in the Verilog description 22, the substitution of the variable B, the variable C, and the variable D may be converted into a non-blocking substitution as compared with the original Verilog description 21, so that the register variable B, the register variable C, and the register variable D may be reduced.

FIG. 11 illustrates an example in which the original Verilog description 21 illustrated in FIG. 10 is described in the SystemC. FIG. 11 is a diagram illustrating an example of the SystemC description. FIG. 11 illustrates an original SystemC description 31 and a SystemC description 32 after the register variables are reduced. As illustrated in FIG. 11, the register variable in the original SystemC description 31 is defined as sc_signal variable, in the example illustrated in FIG. 11, "sc_signal <int 16_t>", and the blocking variable is defined as the member variable of the module class, that is, "int 16_t" in the same example. By such a conversion, the SystemC description 32 in which the register variable is reduced may be obtained as in the example illustrated in FIG. 10.

The simulation execution unit 15E is a processing unit that executes a logic simulation.

In one embodiment, the simulation execution unit 15E executes a logic simulation on the HDL description output by the register variable conversion unit 15D in accordance with the process evaluation order determined by the evaluation order determination unit 15C. At this time, the HDL description is converted into a file in the form of execution by a compiler, and then input to the logic simulator.

By way of example only, in a case where the relationship data 13A2 of the register variable with the process evaluation order illustrated in FIG. 9 is obtained, the simulation execution unit 15E evaluates the process in the order of the process4, the process1, the process2, and the process3. In this way, in a case where the Verilog description 22 after the register variable reduction illustrated in FIG. 10 or the SystemC description 32 after the register variable reduction illustrated in FIG. 11 is input to the logic simulator, the operation of the logic simulation within one clock is as illustrated in FIG. 12.

Figure 12:
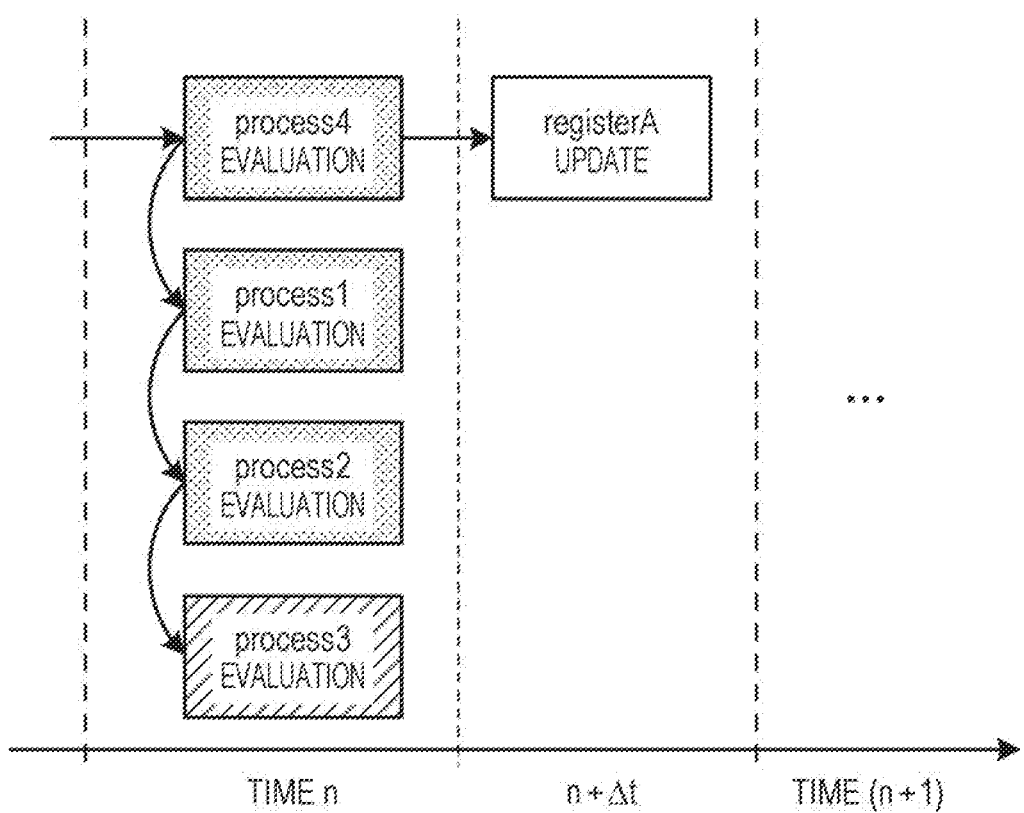
FIG. 12 is a diagram illustrating an example of the process evaluation and the register update.

FIG. 12 is a diagram illustrating an example of a process evaluation and a register update. As illustrated in FIG. 12, the process is evaluated in the order of the process4, the process1, the process2, and the process3 in synchronization with the clock. As a result, the registerA is updated. When comparing this with the example illustrated in FIG. 3, it is clear that the update of the registerB, the registerC, and the registerD is reduced, and the amount of calculation performed for one clock and the data access are reduced. In Retiming, since only the register variable is applied to the register variable coupled to the combinational circuit, it is not possible to reduce the register variables of the registerB, the registerC and the registerD. For this reason, the effect of reducing the register is limited. On the other hand, in the present embodiment, it is possible to reduce the number of register variables by considering the evaluation order of the process, so that it is understood that the effect of reducing the register variable is high.

Although the logic simulation of the circuit model illustrated in FIG. 2 is taken as an example by way of example only, the above-described HDL description conversion may be applied to a logic simulation for an optional circuit model. For example, the above-described HDL description conversion may be applied to a parallel logic simulation such as a multithread method. In parallel execution, by performing register variable relationship table creation, process evaluation order determination, and register variable conversion in units of processes assigned to the same thread to be executed, the individual thread execution may be speeded up. Since the data exchange between the processes assigned to different threads is still performed via the register variable, the result of the parallelization does not change the result of the logic simulation.

By way of example only, the effect was verified with an example of operating 4096 modules having three processes of gen, inc, and chk and two register variables in parallel with respect to the standard simulator of SystemC. The number of the register variables is a total of 8192 (=2*4096). The use environment is "SystemC-2.3.2", and the computer is "Intel CPU Xeon E5-2620v3 @ 2.4 GHz, 1 core". Under such circumstances, the simulation time of the original SystemC description and the SystemC description after the reduction of the register variable is as follows. That is, the simulation time of the original SystemC description is "20.39 seconds", and the simulation time of the SystemC description after the register variable reduction is "6.15 seconds". From this fact, it may be confirmed that a high speed of 3.3 version may be realized by the reduction of the register.

Processing Flow

Figure 13:
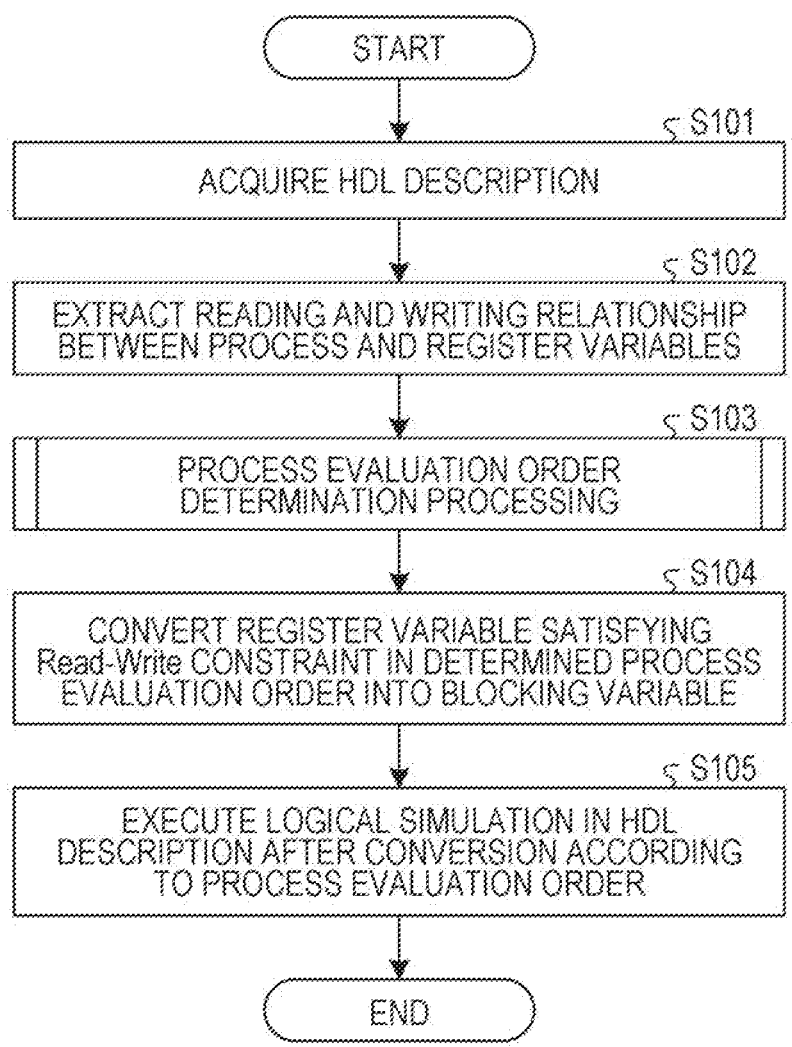
FIG. 13 is a flowchart illustrating the steps of simulation processing according to the first embodiment.

The following describes the processing flow of the simulation apparatus 10 according to this embodiment. FIG. 13 is a flowchart illustrating the steps of simulation processing according to the first embodiment. By way of example only, this processing is started, for example, in a case of receiving a logic simulation execution request from the client terminal 50.

As illustrated in FIG. 13, when the HDL description is acquired by the HDL description acquisition unit 15A (step S101), the relationship extraction unit 15B extracts the reading and writing relationship between the process and the register variable (step S102). Thus, the relationship data 13A1 of the register variable is created.

Subsequently, the evaluation order determination unit 15C executes a "process evaluation order determination processing" for determining the evaluation order of the process in which the register variable which satisfies the Read-Write constraint becomes the maximum, with reference to the relationship data 13A1 of the register variable (step S103). Thus, the relationship data 13A1 of the register variable is updated to the relationship data 13A2 of the register variable with the process evaluation order.

Thereafter, the register variable conversion unit 15D converts the register variable which satisfies the Read-Write constraint in the process evaluation order determined in step S103 out of the register variables of the circuit model included in the HDL description acquired in step S101, into the blocking variable (step S104).

Finally, the simulation execution unit 15E executes a logic simulation on the HDL description in which the register variable is converted into the blocking variable in step S104 in accordance with the process evaluation order determined in step S103, and ends the processing (step S105).

Figure 14:
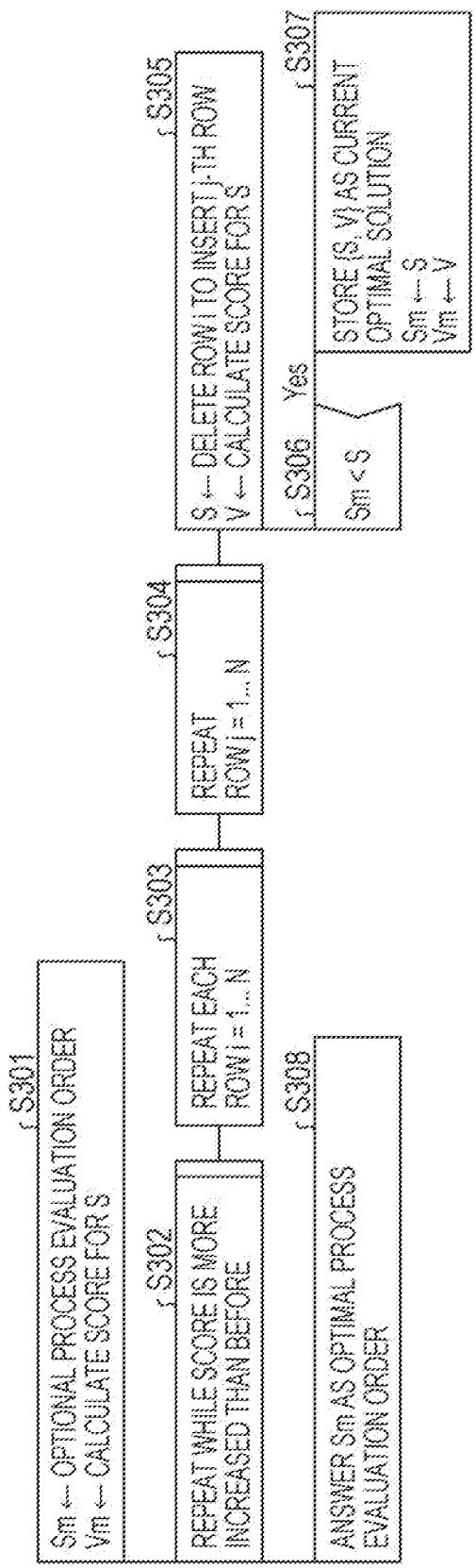
FIG. 14 is a flowchart illustrating a procedure of process evaluation order determination processing according to the first embodiment.

FIG. 14 is a flowchart illustrating a procedure of process evaluation order determination processing according to the first embodiment. This processing is executed after the processing in step S103 illustrated in FIG. 13. By way of example only, FIG. 4 illustrates an example of using a greedy algorithm as an algorithm for searching for an evaluation order of a process for maximizing the number of register variables which satisfies the Read-Write constraint.

As illustrated in FIG. 14, the evaluation order determination unit 15C sets an optional process evaluation order in a register Sm, calculates a score for S, and stores the calculated score in a register Vm (step S301).

Thereafter, the evaluation order determination unit 15C repeatedly executes the processing from step S303 to step S307 while the score is increased, that is, as long as the score is improved (step S302).

That is, the evaluation order determination unit 15C repeatedly executes the processing from step S304 to step S307 for each loop counter i=1, ... N of the row cut from the relationship data 13A1 of the register variable (step S303). The evaluation order determination unit 15C repeatedly executes the processing from step S305 to step S307 for each loop counter j=1, ... N of the row in which the row cut from the relationship data 13A1 of the register variable is inserted (step S304).

More specifically, the evaluation order determination unit 15C deletes the row i designated to be cut in step S303 from the relationship data 13A1 of the register variable, and stores the process evaluation order obtained by inserting the row i in the j-th row in which the insertion is designated in step S304 in a register S. The evaluation order determination unit 15C calculates the score of the process evaluation order S and stores it in a register V (step S305).

The evaluation order determination unit 15C determines whether or not the score V of the process evaluation order S is larger than the specific Vm of the process evaluation order Sm (step S306). When the score V in the process evaluation order S is larger than the specific Vm in the process evaluation order Sm (Yes in step S306), the evaluation order determination unit 15C executes the following processing. That is, the evaluation order determination unit 15C overwrites the value of the register Sm with the value of the register S and overwrites the value of the register Vm with the value of the register V, thereby storing {S,V} as the current optimal solution (step S307).

After that, in a case where the score does not increase in step S303, the evaluation order determination unit 15C outputs the process evaluation order stored in the register Sm as an optimal solution (step S308), and ends the processing.

An example of a method of calculating the above "score" will be described. By way of example only, the "score" may be the sum of the points for each register variable when the relationship data 13A1 and the process evaluation order of the register variable are given. This point is defined as follows with respect to the Read-Write constraint described above.

1) When all Read-Write constraints are satisfied, the point is 1.

2) When a plurality of Write constraints of the Read-Write constraint (C) are not satisfied, the point is co (minus infinity).

3) Other than the above 1) and 2), the point is 0.

For example, in the example of the relationship data 13A1 of the register variable illustrated in FIG. 8, since the points of registers {A to D} are "1", "0", "1", and "0", respectively, the score may be calculated to be "2" by summing them together. In the example of the relationship data 13A2 of the register variable with the process evaluation order illustrated in FIG. 9 in which the fourth row is inserted in the first row, the points of the registers {A to D} are "0", "1", "1", and "1", respectively, and thus the score becomes the maximum "3" by summing them together.

One Aspect of Effects

As described above, the simulation apparatus 10 according to the present embodiment converts the register variable which satisfies the Read-Write constraint which guarantees the operation of the logic simulation into the blocking variable. Therefore, according to the simulation apparatus 10 of the present embodiment, it is possible to reduce the register variable, to reduce the number of times the register is updated, and thereby to increase the speed of the simulation execution.

The simulation apparatus 10 according to the present embodiment determines the evaluation order of the process in which the register variable which satisfies the Read-Write constraint becomes the maximum, and converts the register variable which satisfies the Read-Write constraint into the blocking variable in the evaluation order of the process. Therefore, according to the simulation apparatus 10 of the present embodiment, it is possible to more effectively reduce the register variable.

Second Embodiment

While the embodiment relating to the device of the present disclosure has been described, the present disclosure may be implemented in various different forms other than the embodiment described above. Other embodiments of the present disclosure are described below.

Distribution and Integration

The various components of the devices depicted in the drawings may not be physically configured as depicted in the drawings. Specific forms of the distribution and integration of the devices are not limited to the depicted forms, and all or a portion thereof may be distributed and integrated in any units in either a functional or physical manner depending on various loads, usage states, and the like. For example, the HDL description acquisition unit 15A, the relationship extraction unit 15B, the evaluation order determination unit 15C, the register variable conversion unit 15D, or the simulation execution unit 15E may be coupled via a network as an external device of the simulation apparatus 10. The functions of the simulation apparatus 10 may be realized by the HDL description acquisition unit 15A, the relationship extraction unit 15B, the evaluation order determination unit 15C, the register variable conversion unit 15D, and the simulation execution unit 15E each provided in a separate apparatus and coupling them to each other via a network.

Description Conversion Program

The various kinds of processing described in the aforementioned embodiments may be implemented by executing a program prepared in advance on a computer such as a personal computer or a workstation. Hereinafter, with reference to FIG. 15, an example of a computer configured to execute a description conversion program having functions similar to the above-mentioned embodiments will be described.

Figure 15:
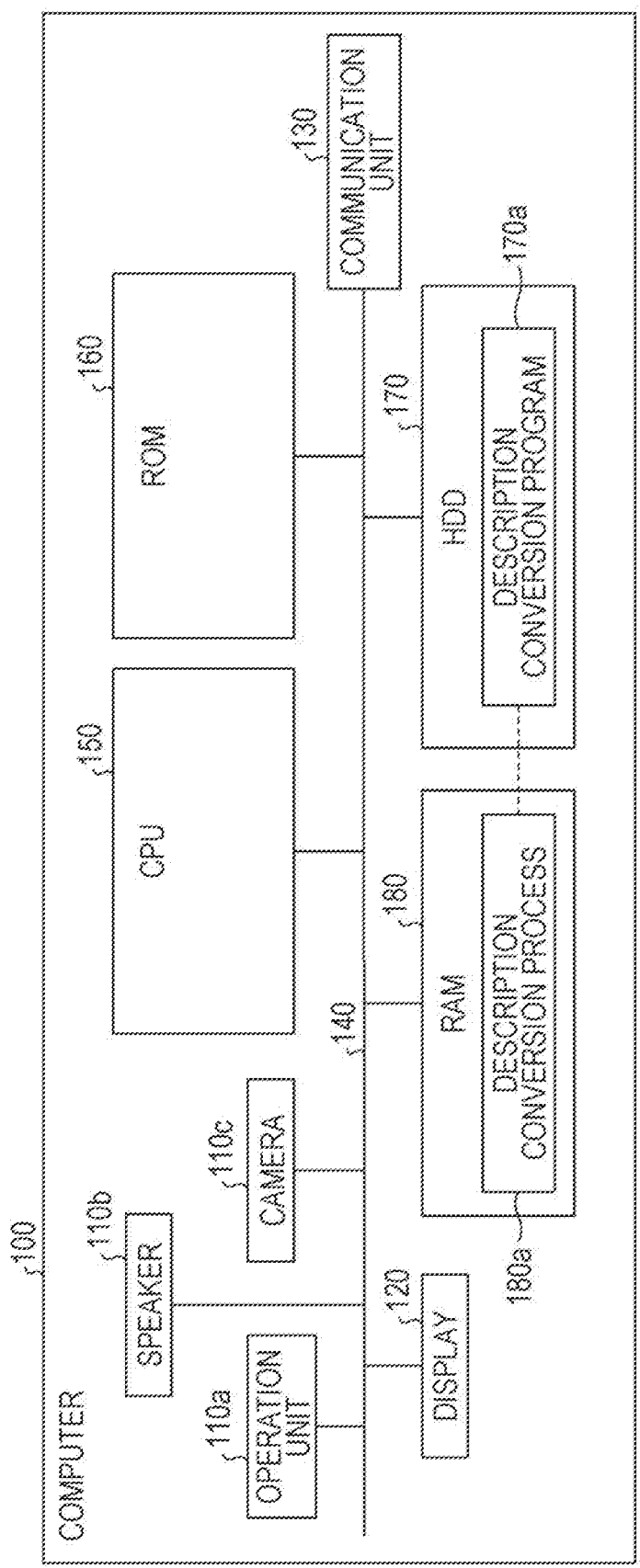
FIG. 15 is a diagram illustrating an example of a hardware configuration of a computer.

FIG. 15 is a diagram illustrating an example of a hardware configuration of a computer. As depicted in FIG. 15, a computer 100 includes an operation unit 110a, a speaker 110b, a camera 110c, a display 120, and a communication unit 130. The computer 100 also includes a CPU 150, a read-only memory (ROM) 160, an HDD 170, and a RAM 180. These units 110 to 180 are coupled to each other via a bus 140.

As illustrated in FIG. 15, the HDD 170 stores a description conversion program 170a which exhibits the same functions as those of the HDL description acquisition unit 15A, the relationship extraction unit 15B, the evaluation order determination unit 15C, and the register variable conversion unit 15D described in the first embodiment. The description conversion program 170a may be integrated or be separated like the components illustrated in FIG. 1. For example, a simulation program in which the function of the simulation execution unit 15E is further packaged may be stored in the HDD 170. The HDD 170 may not have to store all data described in the aforementioned first embodiment, and data used in processing may be stored in the HDD 170.

Under the above-mentioned environment, the CPU 150 reads out the description conversion program 170a from the HDD 170 to be loaded to the RAM 180. As a result, as illustrated in FIG. 15, the description conversion program 170a functions as a description conversion process 180a. The description conversion process 180a loads various types of data read from the HDD 170 in an area allocated to the description conversion process 180a in the storage area included in the RAM 180 and executes various types of processing using these various types of loaded data. For example, the processing performed by the description conversion process 180a includes the processing illustrated in FIG. 13 or 14. Not all the processing units described in first embodiment necessarily have to operate on the CPU 150, but only a processing unit(s) required for the processing to be executed may be virtually implemented.

The description conversion program 170a does not necessarily have to be initially stored in the HDD 170 or the ROM 160. For example, the description conversion program 170a is stored in "portable physical media" such as a flexible disk called an FD, a compact disc (CD)-ROM, a digital versatile disc (DVD), a magneto-optical disk, and an IC card, which will be inserted into the computer 100. The computer 100 may acquire the description conversion program 170a from these portable physical media and execute the description conversion program 170a. The description conversion program 170a may be stored in another computer or server apparatus coupled to the computer 100 via a public line, the Internet, a LAN, a WAN, or the like, and the computer 100 may acquire the description conversion program 170*a* from these and execute the description conversion program 170*a*.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A simulation apparatus comprising:
a memory; and
a processor, coupled to the memory, configured to:
   acquire a circuit model described in a hardware description language;
   extract a reading and writing relationship between a process and a register variable included in the circuit model;
   determine an evaluation order of operations of the process, based on the number of register variables whose extracted relationship satisfies a condition representing a constraint of a reading and writing; and
   convert, into a blocking variable representing a register which holds a value in the circuit model, a register variable which satisfies the condition representing a constraint of a reading and writing in the determined evaluation order of operations of the process among the register variables included in the circuit model.

2. The simulation apparatus of claim 1,
wherein the processor is configured to determine the evaluation order of operations of the process in which the number of register variables whose extracted relationship satisfies a condition is maximum.

3. The simulation apparatus of claim 2,
wherein the processor is configured to determine the evaluation order of operations of the process in which
the number of register variables which satisfies a condition under which
reading by the process corresponding to a sequential circuit is executed before writing,
writing by the process corresponding to a combinational circuit is executed before reading, and
writing to a same register variable by a plurality of the processes is executed in a sequential order
is maximum.

4. The simulation apparatus of claim 1, wherein the processor is further configured to:
output the circuit model in which the register variable is converted into the blocking variable to a given simulator, and output the determined evaluation order of operations of the process to the simulator control as information of the simulator.

5. The simulation apparatus of claim 4,
wherein the processor is configured to output to a cycle-based logic simulator.

6. The simulation apparatus of claim 1,
wherein when a multithread circuit model is acquired by the processor, the processor is configured to be performed using the process and the register variable assigned to the thread as inputs for each thread.

7. The simulation apparatus of claim 1,
wherein the circuit model is a code described in Verilog, VHDL, or SystemC.

8. A computer-implemented conversion method comprising:
acquiring a circuit model described in a hardware description language;
extracting a reading and writing relationship between a process and a register variable included in the circuit model;
determining an evaluation order of operations of the process based on the number of register variables whose extracted relationship satisfies a condition representing a constraint of a reading and writing; and
converting a register variable which satisfies the condition representing a constraint of a reading and writing in the determined evaluation order of operations of the process among the register variables included in the circuit model into a blocking variable representing a register which holds a value in the circuit model.

9. A non-transitory computer-readable recording medium having stored therein a program for causing a computer to execute a process, the process comprising:
acquiring a circuit model described in a hardware description language;
extracting a reading and writing relationship between a process and a register variable included in the circuit model;
determining an evaluation order of operations of the process, based on the number of register variables whose extracted relationship satisfies a condition representing a constraint of a reading and writing; and
converting, into a blocking variable representing a register which holds a value in the circuit model, a register variable which satisfies the condition representing a constraint of a reading and writing in the determined evaluation order of operations of the process among the register variables included in the circuit model.

10. The non-transitory computer-readable storage medium of claim 9,
wherein determining includes determining the evaluation order of operations of the process in which the number of register variables whose extracted relationship satisfies a condition is maximum.

11. The non-transitory computer-readable storage medium of claim 10,
wherein determining includes determining the evaluation order of operations of the process in which
the number of register variables which satisfies a condition under which
reading by the process corresponding to a sequential circuit is executed before writing,
writing by the process corresponding to a combinational circuit is executed before reading, and
writing to a same register variable by a plurality of the processes is executed in a sequential order is maximum.

12. The non-transitory computer-readable storage medium of claim 9,
wherein the process further includes:
outputting the circuit model in which the register variable is converted into the blocking variable to a given simulator, and outputting the determined evaluation order of operations of the process to the simulator control as information of the simulator.

13. The non-transitory computer-readable storage medium of claim 12,
  wherein outputting includes outputting to a cycle-based logic simulator.

14. The non-transitory computer-readable storage medium of claim 9,
  wherein when a multi-threading circuit model is acquired by the acquisition processing, the extraction processing, the determination processing, and the conversion processing are performed using the process and the register variable assigned to the thread as inputs for each thread.

15. The non-transitory computer-readable storage medium of claim 9, wherein the circuit model is a code described in Verilog, VHDL, or SystemC.

* * * * *